(12) United States Patent
Lien et al.

(10) Patent No.: US 7,489,195 B2
(45) Date of Patent: Feb. 10, 2009

(54) VARIABLE GAIN AMPLIFYING CIRCUIT

(75) Inventors: Wee Liang Lien, Singapore (SG);
Rawinder Dharmalinggam, Singapore (SG); Ten Voon Wong, Oakville (CA)

(73) Assignee: MediaTek Singapore Pte Ltd, Aver Rajah Cresent (SG)

( * ) Notice: Subject to any disclaimer, the term of this patent is extended or adjusted under 35 U.S.C. 154(b) by 181 days.

(21) Appl. No.: 11/672,747

(22) Filed: Feb. 8, 2007

(65) Prior Publication Data

US 2008/0191803 A1 Aug. 14, 2008

(51) Int. Cl.
*H03F 3/45* (2006.01)

(52) U.S. Cl. ............ 330/278; 330/260; 330/291; 330/254; 330/296

(58) Field of Classification Search .......... 330/260, 330/261, 254, 296, 291, 278, 284
See application file for complete search history.

(56) References Cited

U.S. PATENT DOCUMENTS 7,034,606 B2 * 4/2006 Caresosa et al. ............ 327/563
7,084,704 B2 * 8/2006 Sowlati ...................... 330/253
7,262,659 B2 * 8/2007 Caresosa et al. ............ 330/254
7,295,068 B2 * 11/2007 Capofreddi et al. ......... 330/254

* cited by examiner

*Primary Examiner*—Michael B Shingleton

(57) ABSTRACT

A variable gain amplifying circuit comprises two stages, a first stage and a second stage with a common voltage-to-current converter. Each stage comprises two BJTs, two voltage controlled current sources, a variable resistor with a variable resistance, and the common voltage-to-current converter. The two BJTs construct a differential amplifier for amplifying a pair of differential signals. The variable resistor with the variable resistance is connected between the emitters of the two BJTs wherein the variable resistance of the variable resistor is represented as $R_E$. The variable resistance $R_E$ is controlled by a control voltage $V_{ctrl}$. The two voltage controlled current sources are respectively connected between the corresponding emitter of BJTs and ground. The currents respectively through the voltage controlled current sources are equal to each other and represented as $I_E$. The current $I_E$ is controlled by the common voltage-to-current converter according to the control voltage $V_{ctrl}$. The variable resistance $R_E$ and the current $I_E$ of the voltage controlled current sources can be varied simultaneously by the control voltage $V_{ctrl}$ so as to rapidly adjust the gain of the variable gain amplifying circuit.

13 Claims, 5 Drawing Sheets

VARIABLE GAIN AMPLIFYING CIRCUIT

FIELD OF THE INVENTION

The present invention relates to a variable gain amplifying circuit, more particularly, to a variable gain amplifying circuit of which each stage has a wide gain range and a rapidly adjustable gain.

BACKGROUND OF THE INVENTION

Automatic gain control (AGC) systems are generally used in many kinds of electronic products, such as communication products, memory storage products, wireless transceivers, etc. The automatic gain control system comprises a variable gain amplifier (VGA) to amplify the received signals whose amplitudes may vary within a wide range so that amplified signals output from the variable gain amplifier can have a substantially constant amplitude.

FIG. 1 is a circuit diagram illustrating a conventional variable gain amplifying circuit 10. The variable gain amplifying circuit 10 is provided for amplifying the differential input signals Vin+ and Vin−. The variable gain amplifying circuit 10 comprises a plurality of stages, such as a first stage 101 and a second stage 102. The first stage 101 comprises two bipolar junction transistors (BJT) 110, 120, three resistors 130, 132, 134, and two voltage controlled current sources 140, 142. The base of BJT 110 is used for receiving the input signal Vin+ and the base of BJT 120 is used for receiving the input signal Vin−. The collector of BJT 110 is used for outputting the output signal Vout1− and the collector of BJT 120 is used for outputting the output signal Vout1+. The output signals Vout1+ and Vout1− are amplified by the first stage 101. The resistor 130 is connected between the emitters of the BJTs 110 and 120. The resistance of resistor 130 is represented as $R_E$. The resistor 132 is connected between $V_{DD}$ and the collector of BJT 110 and the resistor 134 is connected between a voltage source $V_{DD}$ and the collector of BJT 120. Both of the resistances of resistors 132 and 134 are represented as $R_L$. The voltage controlled current source 140 is connected between the emitter of BJT 110 and ground, and the voltage controlled current source 142 is connected between the emitter of BJT 120 and ground. The currents respectively flowing through the voltage controlled current sources 140 and 142 are equal to each other and represented as $I_E$. The current $I_E$ of each current source is controlled by a control voltage $V_{ctrl}$.

As shown in FIG. 1, the gain Av of each stage of the variable gain amplifying circuit 10 can be derived as equation (1):

$$Av = \frac{g_m R_L}{1 + g_m R_E} = \frac{R_L}{\frac{V_T}{I_C} + R_E} \quad (1)$$

where $g_m$ is a transconductance of BJT 110 or 120, $V_T$ is a thermal voltage of BJT 110 or 120, and $I_C$ is a collector current of BJT 110 or 120.

According to equation (1), the gain Av of each stage will be decreased if the collector current $I_C$ decreases due to the decrease of the control voltage $V_{ctrl}$. The emitter current $I_E$ is approximate to the collector current $I_C$ according to the basic characteristic of the BJT. The emitter current $I_E$ is very low when the gain of each stage is very low. It causes that the voltage $V_{headroom}$ (i.e. the voltage drop between two ends of resistor 132, $V_{headroom}=I_E \times R_L$) is very small. The input signals will be "clipped" by the stage of variable gain amplifying circuit 10 when the input signals are large swing AC signals. In other words, the peak of waveform of large swing AC signals will be cut because the voltage $V_{headroom}$ of variable gain amplifying circuit 10 is very small. Accordingly, the variable gain amplifying circuit 10 needs more stages to avoid such a phenomenon.

FIG. 2 is a circuit diagram illustrating another conventional variable gain amplifying circuit 20. The variable gain amplifying circuit 20 is similar to aforementioned variable gain amplifying circuit 10, but instead of using the resistor 130 and two voltage controlled current sources 140, 142 in each stage, a field-effect transistor (FET) 200 is connected to provide the resistance $R_E$ between the emitters of two BJTs 210, 220, and two current sources 240, 242 to provide a steady emitter current $I_E$ to the corresponding BJT respectively. A control voltage $V_{ctrl}$ is inputted into the gate of the FET 200 for controlling the resistance $R_E$.

As shown in FIG. 2, the gain Av of each stage of the variable gain amplifying circuit 20 can be derived as equation (2):

$$Av = \frac{g_m R_L}{1 + g_m R_E} = \frac{R_L}{\frac{1}{g_m} + R_E} \quad (2)$$

where $g_m$ is a transconductance of BJT 210 or 220.

According to equation (2), the gain Av of each stage will be decreased if the resistance $R_E$ increases due to the decrease of the control voltage $V_{ctrl}$. The FET 200 will reach a cut-off or saturation regions when the control voltage $V_{ctrl}$ is low during a low gain Av. It causes that the gain range of each stage is very limited. Accordingly, the variable gain amplifying circuit 20 needs more stages to obtain wider gain range.

Therefore, there is a need for a variable gain amplifying circuit having larger gain range in each stage thereof so that the variable gain amplifying circuit needs fewer stages thereof.

SUMMARY OF THE INVENTION

It is an object of the present invention to provide a variable gain amplifying circuit having a wide gain range in each stage and providing a rapidly adjustable gain in an automatic gain control system.

The variable gain amplifying circuit of an embodiment in accordance with the present invention comprises two stages, a first stage and a second stage with a common voltage-to-current converter. Each stage comprises two BJTs, two voltage controlled current sources, a variable resistor with a variable resistance, and the common voltage-to-current converter. The two BJTs construct a differential amplifier for amplifying a pair of differential signals. The variable resistor with the variable resistance is connected between the emitters of the two BJTs wherein the variable resistance of the variable resistor is represented as $R_E$. The variable resistance $R_E$ is controlled by a control voltage $V_{ctrl}$. The two voltage controlled current sources are respectively connected between the corresponding emitters of the BJTs and ground. The currents respectively flowing through the voltage controlled current sources are equal to each other and represented as $I_E$. The current $I_E$ is controlled by the common voltage-to-current converter according the control voltage $V_{ctrl}$.

The variable resistance $R_E$ of the variable resistor and the current $I_E$ of the voltage controlled current sources can be varied simultaneously according the control voltage $V_{ctrl}$ for rapidly adjusting the gain of the variable gain amplifying circuit. Accordingly, each stage of the variable gain amplifying circuit provides a wider gain range for the same variation of control voltage $V_{ctrl}$ in comparison to prior art.

In contrast to the prior art, the variable gain amplifying circuit of the present invention is capable of providing a rapidly adjustable gain and a wider gain range in each stage. The variable gain amplifying circuit of the present invention can vary the emitter current $I_E$ and the resistance $R_E$ simultaneously according to the variation of the control voltage $V_{ctrl}$. Therefore, the variable gain amplifying circuit of the present invention is capable of preventing signal from being clipped during low gain and providing a wider total gain range with fewer stages.

DETAILED DESCRIPTION OF THE PREFERRED EMBODIMENTS

Figure 1:
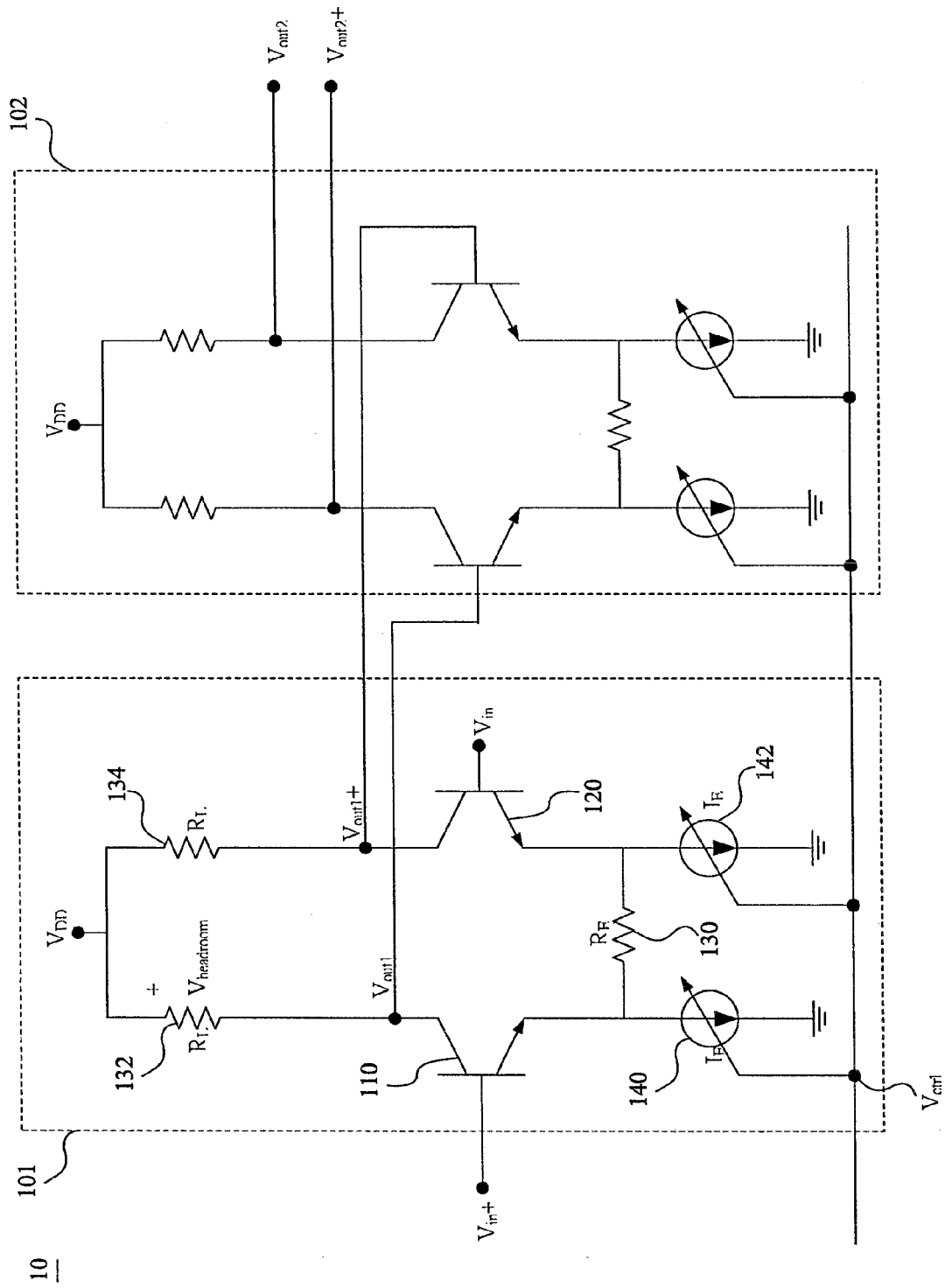
FIG. 1 is a circuit diagram illustrating a conventional variable gain amplifying circuit.
Figure 2:
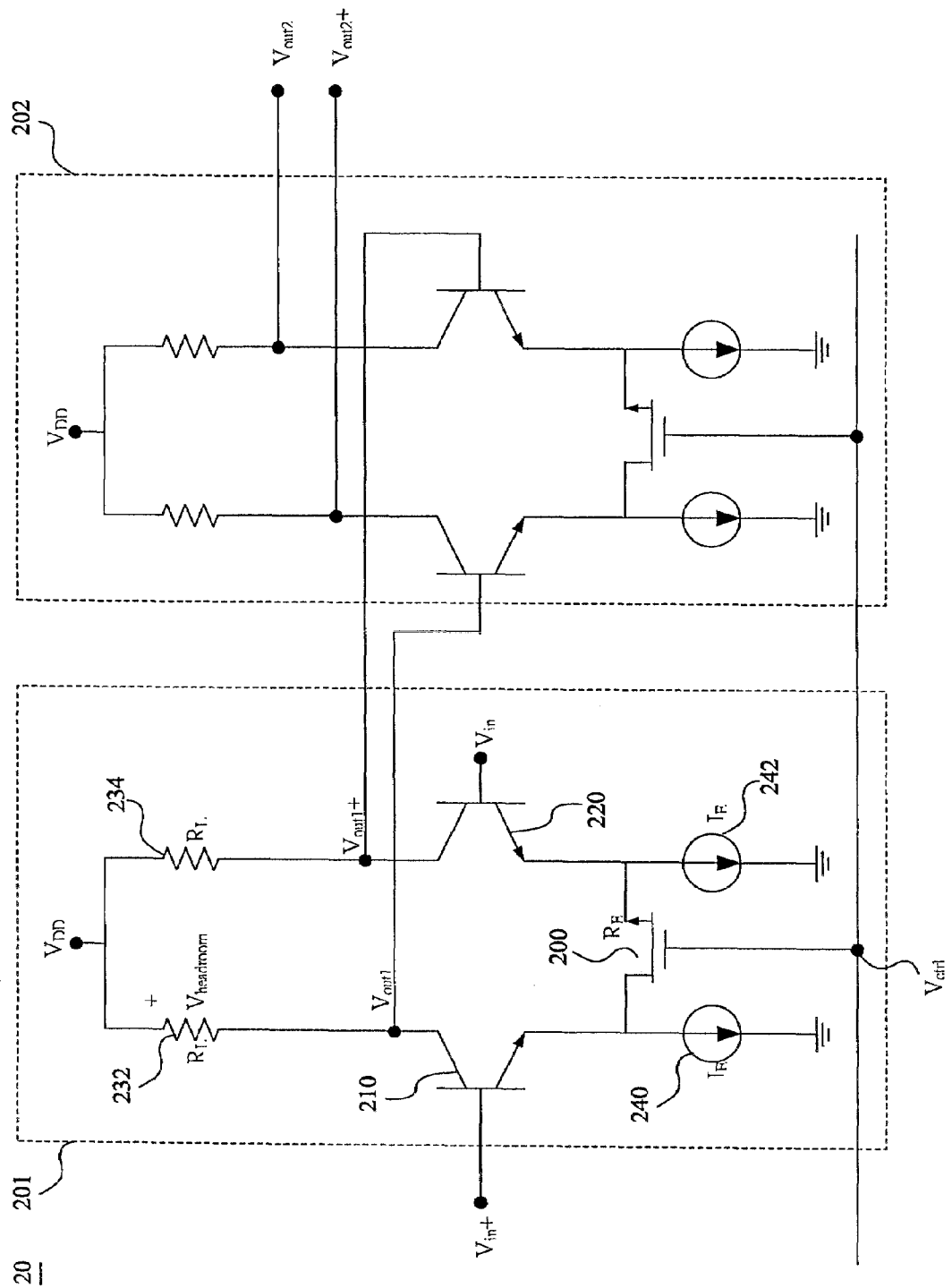
FIG. 2 is a circuit diagram illustrating another conventional variable gain amplifying circuit.
Figure 3:
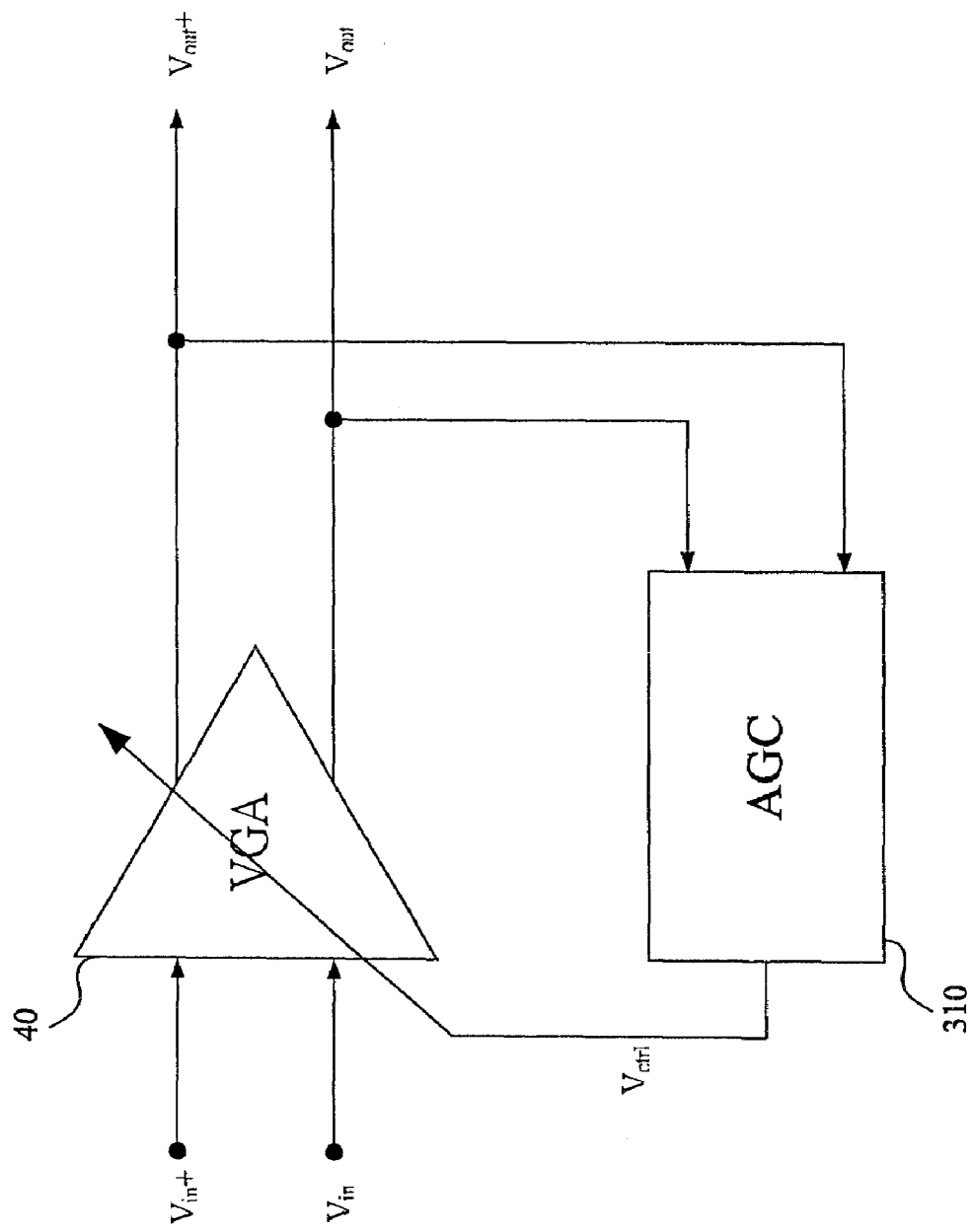
FIG. 3 is a schematic block diagram illustrating an automatic gain control system.

FIG. 3 is a schematic block diagram illustrating an automatic gain control system 30. The automatic gain control system 30 comprises an automatic gain controller 310 and a variable gain amplifying circuit 40. The automatic gain controller 310 generates a control voltage $V_{ctrl}$ to control the gain of the variable gain amplifying circuit 40. The variable gain amplifying circuit 40 receives a differential pair of input signals Vin+ and Vin− to amplify the same with a variable gain corresponding to the control voltage $V_{ctrl}$, then the variable gain amplifying circuit 40 outputs a differential pair of amplified signals Vout+ and Vout−.

Figure 4:
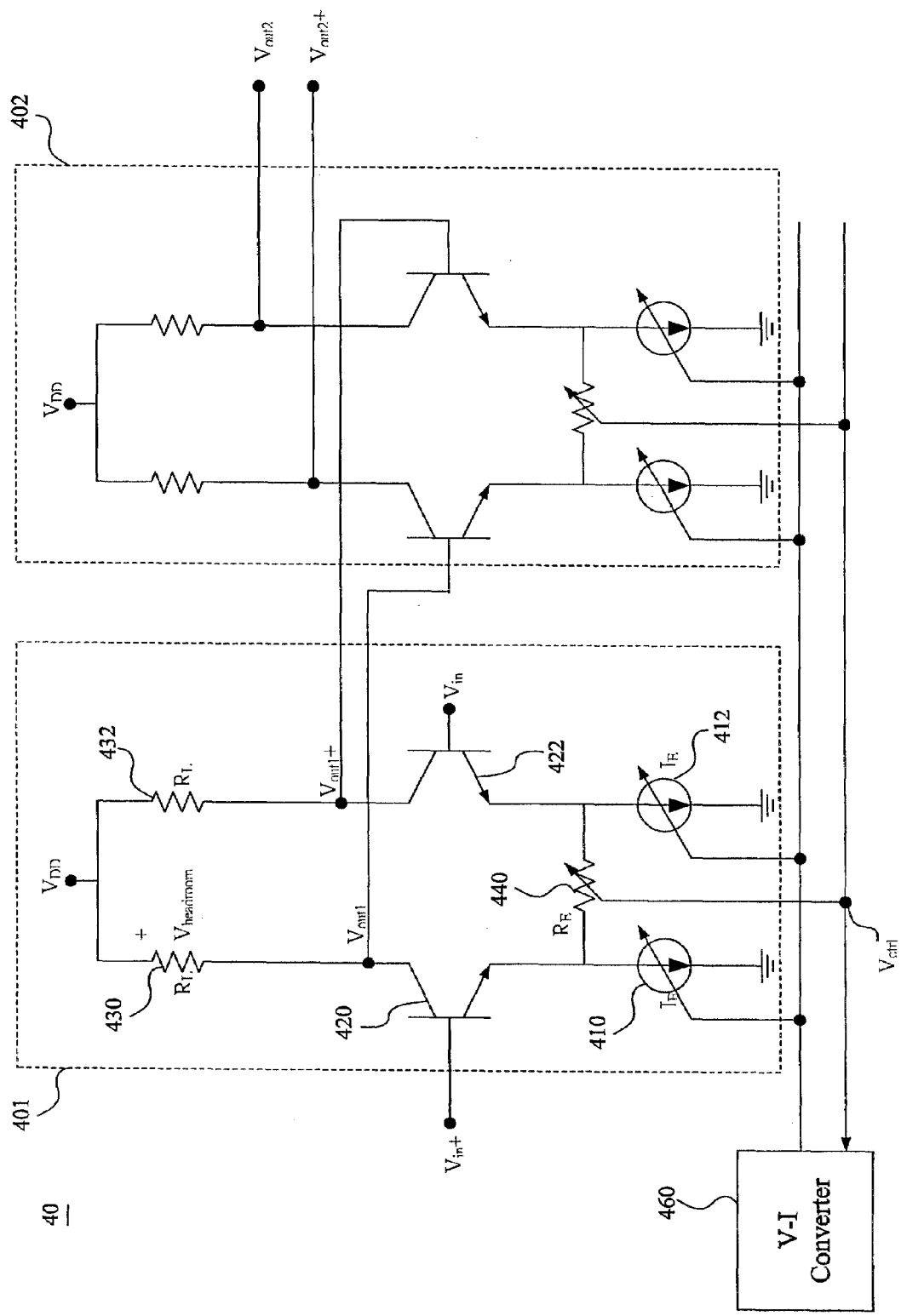
FIG. 4 is a circuit diagram illustrating the variable gain amplifying circuit in accordance with the present invention.

FIG. 4 is a circuit diagram illustrating the variable gain amplifying circuit 40 in accordance with the present invention. The variable gain amplifying circuit 40 of the present embodiment comprises two stages, a first stage 401 and a second stage 402 with a common voltage-to-current converter 460. The first stage 401 comprises two BJTs 420, 422, two resistors 430, 432, two voltage controlled current sources 410, 412, and a variable resistor 440 with a variable resistance. The base of BJT 420 is used for receiving the input signal Vin+ and the base of BJT 422 is used for receiving the input signal Vin−. The collector of BJT 420 is used for outputting the amplified signal Vout1− and the collector of BJT 422 is used for outputting the amplified signal Vout1+ wherein the amplified signals Vout1+ and Vout1− are amplified by the first stage 401. The variable resistor 440 is connected between the emitters of the BJTs 420 and 422 wherein the variable resistance of the variable resistor 440 is represented as $R_E$. The variable resistance $R_E$ of the variable resistor 440 is controlled by a control voltage $V_{ctrl}$. One end of resistor 430 is connected to a voltage source $V_{DD}$ and the other end of resistor 430 is connected to the collector of BJT 420. One end of resistor 432 is connected to the voltage source $V_{DD}$ and the other end of resistor 432 is connected to the collector of BJT 422. Both of the resistances of resistors 430 and 432 are represented as $R_L$. The resistors 430 and 432 can be active loads formed by the MOSFETs (Metal Oxide Semiconductor Field Effect Transistor) or other kinds of electric elements, e.g. BJTs, for providing the resistance $R_L$. The voltage controlled current source 410 is connected between the emitter of BJT 420 and ground, and the voltage controlled current source 412 is connected between the emitter of BJT 422 and ground. The currents respectively flowing through the voltage controlled current sources 410 and 412 are equal to each other and represented as $I_E$. The current $I_E$ is controlled by a voltage to current converting circuit 460 according the control voltage $V_{ctrl}$.

The second stage 402 is substantially identical to the first stage 401, and therefore the descriptions thereof are omitted herein to avoid redundancy. The amplified signals Vout1+ and Vout1− are inputted into the respective bases of corresponding BJTs (not labeled) in the second stage 402. Then the respective collectors of corresponding BJTs in the second stage 402 output the amplified signals Vout2+ and Vout2− which are amplified by the second stage 402. The variable gain amplifying circuit 40 may comprise more than two stages for complying with different requirements in practice. Furthermore, the BJTs 420, 422 of the first stage 401 and such as MOSFETs.

The variable resistance $R_E$ of the variable resistor 440 ascends as the control voltage $V_{ctrl}$ descends, while the current $I_E$ of voltage controlled current source 410 and 412 descends as the control voltage $V_{ctrl}$ descends. As shown in FIG. 4, the gain Av of each stage of the variable gain amplifying circuit 40 can be derived as equation (3):

$$Av = \frac{g_m R_L}{1 + g_m R_E} = \frac{R_L}{\frac{V_T}{I_C} + R_E} \qquad (3)$$

where $g_m$ is a transconductance of BJT 420 or 422, $V_T$ is a thermal voltage of BJT 420 or 422, and $I_C$ is a collector current of BJTs 420 or 422.

According to equation (3), the gain Av of each stage will drop rapidly as the collector current $I_C$ decreases and the variable resistance $R_E$ increases due to the decrease of the control voltage $V_{ctrl}$. The emitter current $I_E$ is approximate to the collector current $I_C$ according to the characteristic of the BJT. Contrarily, the gain Av of each stage will increase quickly when the collector current $I_C$ increases and the variable resistance $R_E$ decreases due to the increase of the control voltage $V_{ctrl}$. Because the collector current $I_C$ and the variable resistance $R_E$ can be varied simultaneously, each stage of the variable gain amplifying circuit 40 has a wider gain range for a same variation of control voltage $V_{ctrl}$ in comparison to prior art. Therefore, a wide gain range of the variable gain amplifying circuit 40 can be achieved with fewer stages. Moreover, the emitter current $I_E$ can be maintained in a higher level during a low gain to prevent signal from being clipped due to a very small voltage $V_{headroom}$ (i.e. the voltage drop between two ends of resistors 430 or 432, $I_E \times R_L$).

Figure 5:
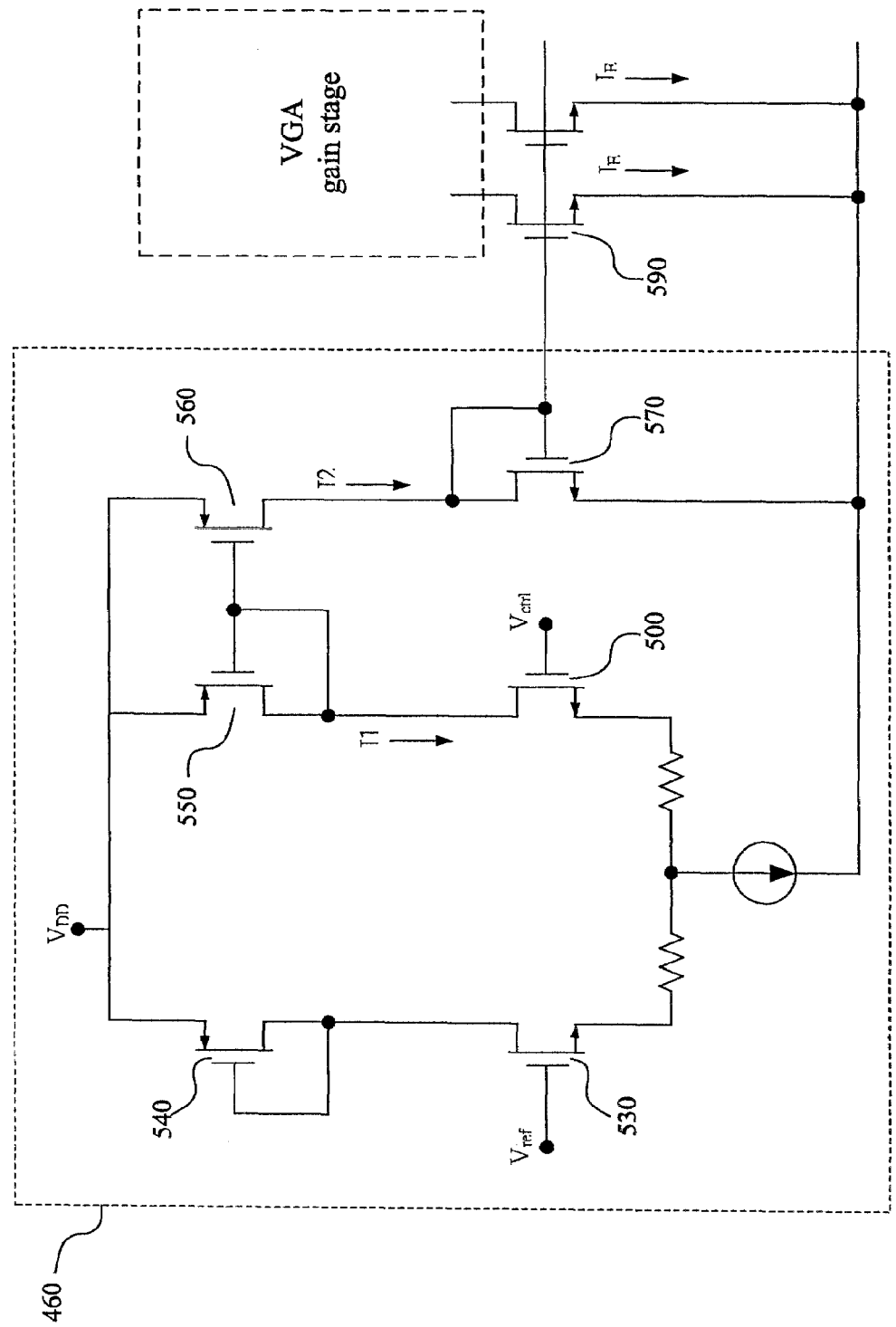
FIG. 5 is a circuit diagram illustrating an embodiment of the common voltage-to-current converter.

FIG. 5 is a circuit view illustrating an embodiment of the common voltage-to-current converter 460. The transistors 500 and 530 construct a differential amplifier. The reference voltage $V_{ref}$ is a steady voltage source and the control voltage $V_{ctrl}$ is larger than the reference voltage $V_{ref}$. The transistors 550 and 560 construct a first current mirror, and the transistors 570 and 590 construct a second current mirror. The current I1 increases as the control voltage $V_{ctrl}$ increases, then the current I2 increases due to the increase of current I1. Finally, the emitter current $I_E$ of each stage increases when the current I2 increases. Therefore, the emitter current $I_E$ of each stage will be varied according to the variation of the control voltage $V_{ctrl}$. The embodiment of the common voltage-to-current converter 460 is only an example. The common voltage-to-current converter can be implemented by any proper manner.

In contrast to the prior art, the variable gain amplifying circuit of the present invention is capable of providing a rapidly adjustable gain and a wider gain range in each stage. The variable gain amplifying circuit of the present invention can vary the emitter current $I_E$ and the resistance $R_E$ simultaneously according to the variation of the control voltage $V_{ctrl}$. Therefore, the variable gain amplifying circuit of the present invention is capable of preventing signal clipped during low gain and providing a wider total gain range with fewer stages.

The mechanism of the embodiment in accordance with the present invention can be implemented in many ways of circuit design, without departing from the spirit and scope of the present invention for any person skilled in the art.

What is claimed is:

1. A variable gain amplifying circuit comprising:
   a gain stage receiving a pair of input signals and amplifying the input signals by a variable gain, the gain stage comprising:
   a first transistor and a second transistor constructing a differential amplifier for amplifying the input signals then outputting a pair of amplified signals;
   a first resistor connected between the first transistor and a steady voltage source;
   a second resistor connected between the second transistor and the steady voltage source;
   a first voltage controlled current source and a second voltage controlled current source for providing variable currents respectively through the first transistor and the second transistor; and
   a variable resistor for providing a variable resistance between the first transistor and the second transistor wherein the variable resistance is controlled by a control voltage; and
   a voltage-to-current converter for controlling the variable currents respectively flowing through the first voltage controlled current source and the second voltage controlled current source according to the control voltage.

2. The variable gain amplifying circuit of claim 1, wherein the first transistor and the second transistor are bipolar junction transistors.

3. The variable gain amplifying circuit of claim 2, wherein the first and second transistors have respective bases for receiving the input signals and respective collectors for outputting the amplified signals, the first resistor and second resistors are respectively connected between corresponding collectors and the steady voltage source, the variable resistor is connected between respective emitters of the first and second transistors, the first and second voltage controlled current sources are respectively connected between corresponding collectors and ground.

4. The variable gain amplifying circuit of claim 1, wherein the first and second transistors are field-effect transistors.

5. The variable gain amplifying circuit of claim 1, wherein the first and second resistors are field-effect transistors, each field-effect transistor has a gate for receiving the control voltage to vary the resistance of the field-effect transistor.

6. The variable gain amplifying circuit of claim 1, wherein the variable currents of the first and second voltage controlled current sources descend as the control voltage decreases.

7. The variable gain amplifying circuit of claim 1, wherein the variable resistance of the variable resistor ascends as the control voltage decreases.

8. A variable gain amplifying circuit comprising:
   a first gain stage for receiving a pair of input signals and outputting a pair of first amplified signals by a first variable gain, the first gain stage comprising:
   a first transistor and a second transistor constructing a first differential amplifier for amplifying the input signals then outputting the first amplified signals;
   a first resistor connected between the first transistor and a steady voltage source;
   a second resistor connected between the second transistor and the steady voltage source;
   a first voltage controlled current source and a second voltage controlled current source for providing variable currents respectively through the first transistor and the second transistor;
   a first variable resistor for providing a first variable resistance between the first transistor and the second transistor wherein the first variable resistance is controlled by a control voltage;
   a second gain stage for receiving the pair of first amplified signals and outputting a pair of second amplified signals by a second variable gain, the second gain stage comprising:
   a third transistor and a fourth transistor constructing a second differential amplifier for amplifying the first amplified signals then outputting the second amplified signals;
   a third resistor connected between the third transistor and the steady voltage source;
   a fourth resistor connected between the fourth transistor and the steady voltage source;
   a third voltage controlled current source and a fourth voltage controlled current source for providing variable currents respectively through the third transistor and the fourth transistor; and
   a second variable resistor for providing a second variable resistance between the third transistor and the fourth transistor wherein the second variable resistance is controlled by the control voltage; and
   a voltage-to-current converter for controlling the variable currents respectively through the first, second, third and fourth voltage controlled current sources according to the control voltage.

9. The variable gain amplifying circuit of claim 8, wherein the first, second, third and fourth transistors are bipolar junction transistors.

10. The variable gain amplifying circuit of claim 8, wherein the first, second, third and fourth transistors are field-effect transistors.

11. The variable gain amplifying circuit of claim 8, wherein the first, second, third and fourth resistors are field-effect transistors, each field-effect transistor has a gate for receiving the control voltage to vary the resistance of the field-effect transistor.

12. The variable gain amplifying circuit of claim 8, wherein the variable currents of the first, second, third and fourth voltage controlled current sources descend as the control voltage decreases.

13. The variable gain amplifying circuit of claim 8, wherein the first and second variable resistances of the first and second variable resistors ascend as the control voltage decreases.

* * * * *